(12) United States Patent
Beche et al.

(10) Patent No.: US 10,643,884 B2
(45) Date of Patent: May 5, 2020

(54) METHOD FOR MANUFACTURING A SEMICONDUCTOR STRUCTURE WITH TEMPORARY DIRECT BONDING USING A POROUS LAYER

(71) Applicant: COMMISSARIAT A L'ENERGIE ATOMIQUE ET AUX ENERGIES ALTERNATIVES, Paris (FR)

(72) Inventors: Elodie Beche, Grenoble (FR); Frank Fournel, Villard-Bonnot (FR); Vincent Larrey, La Murette (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 25 days.

(21) Appl. No.: 15/751,043

(22) PCT Filed: Aug. 8, 2016

(86) PCT No.: PCT/EP2016/068845
§ 371 (c)(1),
(2) Date: Feb. 7, 2018

(87) PCT Pub. No.: WO2017/025494
PCT Pub. Date: Feb. 16, 2017

(65) Prior Publication Data
US 2018/0358261 A1    Dec. 13, 2018

(30) Foreign Application Priority Data

Aug. 12, 2015  (FR) ..................................... 15 57689

(51) Int. Cl.
*H01L 21/762* (2006.01)
*C09J 5/06* (2006.01)
(Continued)

(52) U.S. Cl.
CPC .......... *H01L 21/76251* (2013.01); *C09J 5/06* (2013.01); *H01L 21/311* (2013.01); *H01L 21/76259* (2013.01); *H01L 21/84* (2013.01)

(58) Field of Classification Search
CPC . H01L 21/76251; H01L 21/311; H01L 21/84; H01L 21/02203; H01L 21/6835;
(Continued)

(56) References Cited

U.S. PATENT DOCUMENTS 6,417,069 B1 * 7/2002 Sakaguchi ........ H01L 21/76259
204/237
7,579,259 B2   8/2009 Fournel
(Continued)

FOREIGN PATENT DOCUMENTS

| EP | 2 977 069 A1 | 1/2016 |
| FR | 3 002 812 A1 | 9/2014 |

OTHER PUBLICATIONS

International Search Report dated Oct. 19, 2016, in PCT/EP2016/068645 filed Aug. 8, 2016.
(Continued)

*Primary Examiner* — Charles D Garber
*Assistant Examiner* — Alia Sabur
(74) *Attorney, Agent, or Firm* — Oblon, McClelland, Maier & Neustadt, L.L.P.

(57) ABSTRACT

A method for manufacturing a semiconductor structure, including: direct bonding a substrate to be handled with a handle substrate via a bonding layer covering the handle substrate, to form a temporary structure capable of withstanding technological steps; disassembling the temporary structure at the bonding layer to separate the substrate to be handled from the handle substrate; and a prior depositing the bonding layer onto the handle substrate and/or onto the substrate to be handled, the bonding layer including a porous
(Continued)

material including, an inorganic matrix and organic compounds connected or not to the matrix, and the disassembling is carried out by providing a thermal budget for disassembly to the intermediate structure, the providing resulting in a spontaneous disassembly of the temporary structure occurring at the bonding layer.

19 Claims, 4 Drawing Sheets

(51) Int. Cl.
*H01L 21/311* (2006.01)
*H01L 21/84* (2006.01)
(58) Field of Classification Search
CPC . H01L 2221/68318; H01L 2221/68304; H01L 2224/83894; H01L 2224/81894; H01L 21/02126; H01L 21/683; C09J 5/06
See application file for complete search history.

(56) References Cited

U.S. PATENT DOCUMENTS

| | | | |
|---|---|---|---|
| 7,781,300 B2 | 8/2010 | Moriceau | |
| 7,863,156 B2 | 1/2011 | Deguet | |
| 8,530,331 B2 | 9/2013 | Beneyton | |
| 8,692,337 B2 | 4/2014 | Berthelot | |
| 8,828,244 B2 | 9/2014 | Fournel | |
| 8,871,607 B2 | 10/2014 | Signamarcheix | |
| 9,029,178 B2 | 5/2015 | Larrey | |
| 9,321,636 B2 | 4/2016 | Fournel | |
| 9,783,407 B2 | 10/2017 | Giroud | |
| 2005/0285290 A1 | 12/2005 | Nakanishi | |
| 2006/0264004 A1* | 11/2006 | Tong | H01L 21/76254 438/455 |
| 2008/0315213 A1* | 12/2008 | Noe | H01L 33/0079 257/79 |
| 2010/0123224 A1 | 5/2010 | Lin et al. | |
| 2012/0178253 A1* | 7/2012 | Ahn | C23C 16/401 438/643 |
| 2013/0252399 A1* | 9/2013 | Leduc | H01L 21/0226 438/455 |
| 2014/0014618 A1* | 1/2014 | Fournel | H01L 21/2007 216/34 |

OTHER PUBLICATIONS

Foreign Search Report dated Jun. 6, 2016 in French Application No. 15 57689 filed Aug. 12, 2015.
Takao Yonehara et al., "ELTRAN; Novel SOI Wafer Technology", JSAP International, vol. 4, Jul. 2001, pp. 10-16.
U.S. Appl. No. 15/571,573, Frank Fournel.
U.S. Appl. No. 15/746,041, Frank Fournel.
U.S. Appl. No. 12/296,250, filed Dec. 5, 2008, US 2009-0162991 A1, Remi Beneyton.

* cited by examiner

METHOD FOR MANUFACTURING A SEMICONDUCTOR STRUCTURE WITH TEMPORARY DIRECT BONDING USING A POROUS LAYER

TECHNICAL FIELD

The field of the invention is that of the production of semiconductor structures for electronics, optics or microelectronics. The invention more particularly relates to a method for manufacturing a semiconductor structure involving the temporary direct bonding of a substrate onto another substrate.

PRIOR ART

A method for manufacturing a semiconductor structure may involve layer transfers. If the thickness of the layer to be transferred is thin (typically less than 200 μm), it cannot be handled by conventional means used to handle substrates as there is the risk of it splitting, or more generally becoming damaged during the transfer thereof.

One efficient means for overcoming this risk is to mechanically strengthen the layer to be transferred by the temporary bonding of the substrate comprising the layer to be transferred, called the substrate to be handled, onto another substrate, called the handle substrate. The layer to be transferred can therefore be handled without restriction and can undergo all manufacturing steps required to take place for the transfer thereof, and more generally for the treatment thereof during FEOL step (Front End Of the Line, which describes all steps for manufacturing the active components of an integrated circuit).

The temporary bonding of the two substrates can take place using an adhesive layer or by direct bonding to form a temporary structure capable of withstanding technological steps for manufacturing a semiconductor structure. Once these steps are complete, the two substrates are separated.

In the case of bonding using an adhesive layer, the separation of the two substrates includes the disassembly of the temporary structure by mechanical means and/or by providing a thermal budget for transforming the adhesive layer. After separation, a certain level of organic contamination remains on the substrates, which can be removed by chemical cleaning or plasma. This sequence of steps prevents the handle substrate from being consumed. However, the adhesive materials, of the polymer type, can become degraded and unstable under the mechanical or thermal stresses applied to the temporary structure. In particular, it appears to be almost impossible to perform technological steps for manufacturing semiconductor structures that implement heat treatments in excess of 400° C.

In the event of direct bonding, this process commonly takes place by oxide-oxide direct bonding (thermal or native oxide) of silicon substrates. Annealing of the temporary structure produced by the bonding generally takes place so that mechanical disassembly is not possible without the risk of damaging the thin layer or the handle substrate. The separation of the thin layer from the handle substrate then takes place by removal of the handle substrate, for example by mechanical-chemical abrasion. This method therefore requires a handle substrate to be sacrificed for each thin layer treated, which generates substantial costs.

Methods have been proposed that allow the temporary structure to be disassembled, the two substrates to be separated and the handle substrate to be recycled, which methods consist of including one or more previously weakened layers in the stack forming the temporary structure. Under mechanical or thermal stresses, said previously weakened layers are caused to split.

One known method therefore consists of pre-weakening the substrate to be handled by creating a buried porous layer therein. The addition of external mechanical energy causes this porous layer to split. This technique is, for example, used in the ELTRAN® method, a description of which can be found in the article entitled "Eltran®, Novel SOI Wafer Technology", JSAP International. 2001, Vol. 4., by T. Yonehara and S. Koyofumi. Due to the split within the substrate to be handled, this technique has the disadvantage of resulting in a loss of material. The residues of the porous layer are also difficult to remove by selective etching as they are made of the same chemical element as the substrate. Finally, the surfaces of the separated substrates are non-uniform and a CMP (chemical-mechanical polishing) step is required, which generates significant costs. One specificity of this step is also that it consumes part of the substrate.

Moreover, the patent application EP 2 977 069 A1 discloses a method consisting of using a sacrificial previously weakened layer at the bonding interface. This layer is weakened by ion implantation and splits when subjected to heat. The intermediate structure is disassembled at the sacrificial layer, and not in one of the substrates, and therefore does not cause a loss of material at the substrates. However, this method also requires a prior weakening operation.

DESCRIPTION OF THE INVENTION

The invention relates to a method for manufacturing a semiconductor structure involving the temporary direct bonding of a substrate onto another substrate. The purpose of the invention is to procure a bonding that is strong enough to allow technological steps for manufacturing the semiconductor structure to take place at a high-temperature (for example at 600° C.) without the risk of detachment, using a method that is simpler and less expensive than the methods requiring a prior operation for weakening a substrate or a layer.

The invention therefore proposes a method for manufacturing a semiconductor structure, comprising the steps of:
direct bonding of a substrate to be handled with a handle substrate via a bonding layer coating the handle substrate, in order to form a temporary structure capable of withstanding technological steps; and
disassembly of the temporary structure at the bonding layer in order to separate the substrate to be handled from the handle substrate,
characterised in that it comprises a prior step of depositing the bonding layer onto the handle substrate and/or onto the substrate to be handled, the bonding layer being made of a porous material made up of an inorganic matrix and organic compounds connected or not to said matrix, and in that the disassembly step is carried out by providing a thermal budget for disassembly to the intermediate structure, said providing resulting in a spontaneous disassembly of the temporary structure occurring at the bonding layer.

Some preferred, however non-limiting aspects of said method are as follows:
the providing of the thermal budget for disassembly takes place under a controlled atmosphere, for example a nitrogen or mixed $N_2$—$O_2$ atmosphere;
the providing of the thermal budget for disassembly is an annealing process that takes place at a temperature exceeding 600° C. for a duration of more than 10 minutes;

it further comprises a step of strengthening the bonding implemented by providing a thermal budget for reinforcement to the temporary structure;

it further comprises, before the disassembly step, a step of assembling a free rear side of the substrate to be handled with a receiving substrate;

it further comprises a step of recycling the handle substrate comprising the removal of residues of the bonding layer present at the surface of the handle substrate after the disassembly step by selective etching;

the bonding layer has a porosity that lies in the range 10% to 80%, preferably in the range 15% to 35%;

the bonding layer is a layer of organosilicon material;

it comprises, after the deposition of the bonding layer, a step of modifying the porous material by thermal, chemical, UV, electron beam or plasma post-treatment;

it comprises, after the direct bonding step, the formation of at least one cut in the handle substrate or in the substrate to be handled in order to isolate regions of the handle substrate, or respectively of the substrate to be handled, from each other, the disassembly of the temporary structure resulting in a partial separation of the handle substrate, or respectively of the substrate to be handled, located at least one isolated region of the handle substrate, or respectively of the substrate to be handled;

it comprises the formation of a cut in the handle substrate separating a central portion of the handle substrate from a peripheral portion of the handle substrate, the disassembly of the temporary structure resulting in a partial separation of the handle substrate located at the central portion of the handle substrate, whereby the substrate to be handled rests on the peripheral portion of the handle substrate.

BRIEF DESCRIPTION OF THE FIGURES

Other aspects, purposes, advantages and characteristics of the invention shall be better understood upon reading the following detailed description given of the non-limiting preferred embodiments of the invention, provided for illustration purposes with reference to the appended figures, in which.

DETAILED DESCRIPTION OF THE SPECIFIC EMBODIMENTS

The invention discloses a method for manufacturing a semiconductor structure using a handle substrate to support a substrate to be handled.

A semiconductor structure is understood to be any structure that is used to manufacture a device with semiconductors. A semiconductor structure can include conductive, semi-conductive and/or non-conductive materials. It can be a layer that optionally comprises microcomponents, regardless of whether said microcomponents are finished or semifinished.

A handle substrate is understood to be a composite structure, the function of which is to provide a temporary mechanical support for a substrate or a structure. The handle substrate is, for example, a silicon substrate.

A substrate to be handled is understood to be a substrate that is temporarily assembled with a handle substrate and on which treatments can take place, in particular FEOL or BEOL ("Back End Of the Line") technological steps. It can be, for example, a substrate comprising finished or semifinished microcomponents to be transferred onto a receiving substrate.

A description of the method according to the invention is firstly provided with reference to FIGS. 1a to 1d, which show a first embodiment.

Figure 1A:
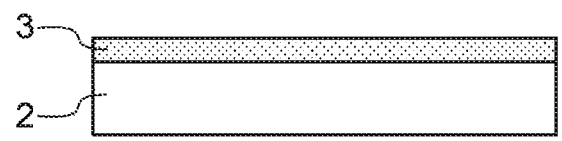
FIGS. 1a-1d show a first embodiment of the method according to the invention.

In a first step shown in FIG. 1a, a bonding layer 3 made of a porous material is deposited onto the handle substrate 2.

Figure 1B:
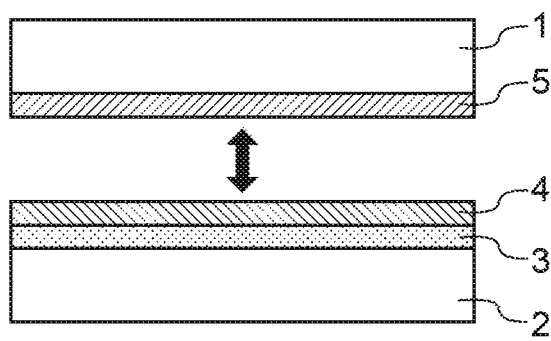
Figure 1C:
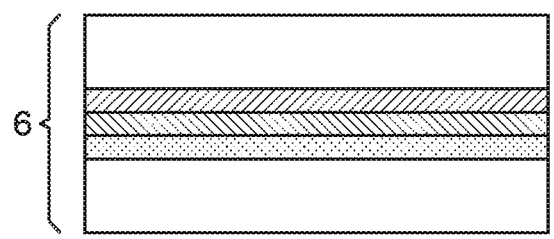

In a second step shown in FIG. 1b, the substrate to be handled 1 undergoes direct bonding with the handle substrate 2 via the bonding layer made of a porous material 3 coating the handle substrate.

Direct bonding is understood to be bonding by molecular adhesion of the surfaces placed in contact with each other, without the use of any specific material such as glue. Direct bonding can take place at ambient temperature and at atmospheric pressure. It can be preceded by prior treatment of the bonding surfaces, for example chemical treatment intended to make said bonding surfaces hydrophilic or treatment intended to reduce the roughness thereof.

Alternatively, the bonding layer made of porous material can be deposited onto the substrate to be handled 1 or on both sides, i.e. both on the substrate to be handled 1 and on the handle substrate 2.

As shown in FIG. 1b, the bonding layer 3 can be coated with an additional layer 4 intended to ease bonding, for example in the form of a silicon oxide surface layer. Similarly, an additional layer 5 can coat the substrate to be handled 1.

After direct bonding has taken place (FIG. 1c), a temporary structure 6 is obtained, formed from the stack of the substrate to be handled 1 assembled with the handle substrate 2 via the bonding layer 3.

Said bonding is strong enough to allow the temporary structure 6 to withstand high-temperature technological steps (for example at 600° C.), which is not possible when bonding is performed using polymer or metal layers. These technological steps can in particular include the formation of at least one portion of a microtechnological component and/or the formation of at least one insulating layer.

In one possible embodiment of the invention, a step of strengthening the bonding can be implemented by providing a so-called thermal budget for reinforcement to the temporary structure 6. This reinforcement of the bonding can be obtained by, annealing for a duration exceeding 10 minutes at a temperature lying in the range 100° C. to 600° C.

This reinforcement takes place to allow subsequent technological steps to be performed, in particular those having higher thermal budgets. The reinforcement advantageously corresponds to a first heat treatment of the intermediate structure, implemented prior to the subsequent technological steps. However, said subsequent technological steps can also contribute to the thermal budget for reinforcing the mechanical strength of the bonding.

Figure 1D:
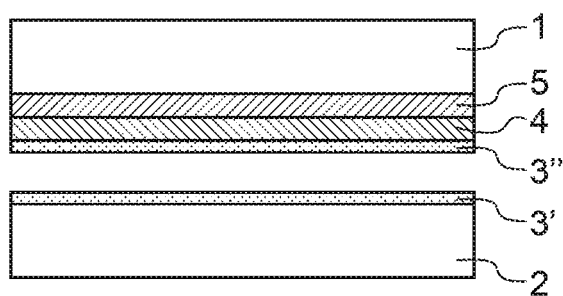

With reference to FIG. 1d, in particular once the different technological steps have been performed, the temporary structure 6 is disassembled at the bonding layer made of porous material 3 in order to separate the substrate to be handled 1 from the handle substrate 2.

This disassembly takes place by providing a so-called thermal budget for disassembly to the intermediate structure 6, said providing resulting in the spontaneous disassembly, without the application of mechanical stress, of the temporary structure occurring at the bonding layer made of porous material 3.

Disassembly can take place under a controlled atmosphere, for example for a bonding layer made of an organosilicon material under a nitrogen or mixed $N_2$ and $O_2$ atmosphere, in order to control the reaction between said atmosphere and the bonding layer 3, and thus better control the disassembly conditions (higher or lower temperature, longer or shorter duration, etc.).

Providing the thermal budget for disassembly can take place by annealing for a duration exceeding 10 minutes at a temperature exceeding 600° C. In one possible embodiment, the thermal budget for reinforcement and the thermal budget for disassembly can be combined into a single thermal budget. Said thermal budget therefore acts to reinforce the mechanical strength of the intermediate structure, then to disassemble said structure.

Disassembly thus takes place by splitting within the bonding layer 3 made of porous material, and not within one of the substrates. The substrate to be handled and the handle substrate are therefore not damaged.

After splitting has occurred, the handle substrate 2 is present on the one hand, coated with a portion 3' originating from the split of the bonding layer 3, and the substrate to be handled is present on the other hand, also coated with a portion 3" originating from the split of the bonding layer 3. Said portions 3', 3" have be seen to have identical thicknesses, whereby the split takes place in the middle of the thickness of the bonding layer 3. The handle substrate 2 can be easily recycled via a recycling step comprising the removal of the residues 3' of the porous bonding layer present at the surface of the handle substrate after the disassembly step. This removal step has the advantage of being possible by selective etching, which is less expensive than a CMP operation. The residues 3" present on the substrate to be handled 1 can be removed in a similar manner by selective etching. Alternatively, a CMP operation can be performed when looking to reduce the surface roughness of the porous material (without fully removing the latter) and continue the manufacturing process for the substrate to be handled.

It should be noted that this method is simpler and less expensive than the methods of the prior art. The ability to disassemble the structure is provided by the simple deposition of a single layer, and does not require any prior weakening operation (for example by mechanical means or ion implantation) for one of the substrates or the bonding layer.

The bonding layer made of porous material 3 used within the scope of the invention is made of a porous inorganic matrix (metal, dielectric, semi-conductive and more particularly in the examples given below, a matrix containing Si—O bonds) and organic compounds connected or not to the matrix (carbonate cycles, carbonate chains). It could therefore be, for example, a porous layer of organosilicon material SiOC(H).

This composition choice allows the assembly to be spontaneously disassembled by a twofold mechanism. Under the effect of heat treatment, the porous material densities at the periphery of the wafer, thus creating a sealed area at the edge of the wafer. The gases present in the porous material then become trapped within the temporary structure 6. The expansion of said trapped gases with the temperature results in a spontaneous split forming within the porous layer.

This bonding layer made of porous material also has the special ability to change under treatment, for example under heat treatment, chemical treatment or UV treatment. The porosity of the bonding layer can therefore be adjusted or created using such a treatment (in the case of deposition via a porogenic approach). This change can be mechanical (for example densification or change to the porosity state) or chemical (for example production or desorption of gaseous species).

The bonding layer made of porous material 3 can be deposited by physical means (for example: PVD—or "Physical Vapor Deposition"—and its derivatives), radical means (for example: sol-gel and its derivatives), or chemical means (for example: CVD—or "Chemical Vapor Deposition"—and its derivatives), and more particularly in the examples given below, by PECVD ("Plasma Enhanced Chemical Vapor Deposition").

The bonding layer made of a porous material 3 can be a layer whose porosity is self-generated by steric hindrance on certain groups such as cyclic groups (example matrix precursors: trimethyltrivinylcyclotetrasiloxane (V3D3) or tetramethylcyclotetrasiloxane (TMCTS)), methyl groups or carbon derivative groups (example matrix precursors: hexamethyldisiloxane (HMDSO), bistrismethylsilylmethane (BTMSM), methylsilane (1MS), dimethylsilane (2MS), trimethylsilane (3MS), bis (trimethylsiloxy)methylsilane (BTMS), methyltrimethoxysilane (MTMS)).

The bonding layer made of a porous material 3 can also be a layer whose porosity is generated by a porogenic approach according to which organic porogenic agents are introduced during the deposition of the matrix precursor and then removed by heat treatment, UV treatment or by electron beam ("e-beam").

Porogenic agents can be chemically bonded to the matrix precursor (for example: vinyltrimethylsilane (VTMS), divinyldimethylsilane (DVMS), tetravinylsilane (TVS), diphenylmethylsilane (DPMS)), or can be co-deposited with the matrix precursor (example porogenic agents: diethoxymethylsilane (DEMS), cyclohexene (CHO), decamethyl-cyclopentasiloxane (DMCPSO), 1-hexene, bicyclohexadiene (BCHD), cyclopentene oxide (CPO)).

In the embodiments given below, the co-deposition by PECVD of a matrix precursor of the type Methyl-Diethoxy-Silane (MDEOS) and of porogenic agents of the type norbornadiene (NBD) takes place under He and $O_2$ flows. After removal of the porogenic agents, a porous layer is obtained, which layer has an inorganic Si—O—Si matrix comprising methyl groups or derivatives connected to the matrix by the silicon atom (SiO—$CH_3$).

The removal of the porogenic agents, which takes place by heat treatment, UV treatment or by e-beam, generates a porosity level that varies from 10% to 80% (and more particularly in the examples between 20-30%±5%) and also in most cases generates a reduction in thickness (in the range 5% to 25% in the examples). This removal can take place such that the porogenic agents are partially removed or are not removed.

One or more subsequent steps can be implemented in order to modify the porous layer deposited, for example in order to change the porosity level, the chemical composition and/or the quantity of remaining porogenic agents. These steps involve, for example, an additional treatment by heat, UV or e-beam, a chemical treatment (for example HF etching widening the radius of the pores) or plasma treatment. It should be noted that when subjected to heat treatment, for example, the carbon groups (remaining porogenic agents and/or methyl groups) are capable of decomposing into gaseous form. Therefore, the method according to the invention can comprise, after the deposition of the bonding layer made of porous material, a step of modifying the porous material by thermal, chemical, UV, electron beam or plasma post-treatment. It is therefore possible, by engineering the porous material deposited, to change some of the properties thereof, and thus change the temperature at which disassembly occurs. The composition and physical-chemical properties of the porous material are therefore chosen in order to adapt the thermal budget for reinforcing the mechanical strength and for disassembling the temporary structure.

The gases used during the deposition of the porous layer and the gases released during post-treatment of the porous layer deposited can become trapped inside the bonding layer, for example according to the deposition technique used. Therefore, the disassembly phenomenon can be controlled by modulating the quantity of gas produced. Indeed, this is the expansion of the gases trapped as a result of the sealed area at the edge of the wafer that causes the spontaneous disassembly.

One embodiment of the invention with two 200 mm P-doped silicon substrates (100) is described below. The handle substrate is coated in a 300-nm layer of porous SiO—$CH_3$ by the co-deposition of MDEOS+NBD by PECVD under He and $O_2$. The porogenic agents are removed by UV and heat treatment, which causes a reduction in thickness of about 15%±5%. The deposited layer has a chemical composition of about 15%±5% of Si, 20%±5% of C and O, 45%±5% of H and a porosity of about 20%±10%. The pore size, measured by ellipsometry-porosimetry, is about 1 nm±30%. The substrate to be handled is a blank substrate, not coated with a thermal oxide. The two substrates undergo chemical treatment in order to make the porous SiO—$CH_3$ and silicon surfaces hydrophilic, which surfaces are known to be very hydrophobic. This treatment consists of chemical cleaning of the type $O_3$+RCA. After these different treatments, the surface roughness is about 5 Å RMS (Root Mean Square) for the deposited SiO—$CH_3$ porous layer and about 1.5 Å RMS for the silicon substrate to be handled, which is compatible with direct hydrophilic bonding. The two substrates are therefore bonded by the direct bonding method at ambient temperature and atmospheric pressure in order to form the so-called intermediate structure.

Said intermediate structure can then withstand heat treatments at up to 600° C. without detachment. Annealing then takes place at a higher temperature, at 900° C. for 2 h in a mixed $O_2$+$N_2$ atmosphere, and results in the disassembly of said structure by splitting within the porous SiO—$CH_3$ layer. Splitting more particularly takes place in the middle of the porous layer as shown by the thickness measurements taken by ellipsometry. The thickness of the porous layer transferred to the substrate to be handled after splitting is about 100 nm±5% and the thickness of the porous layer remaining on the handle substrate is also about 100 nm±5%. An area at the edge of the wafer, corresponding to the sealed area, is, visible to, the naked eye. It is 118 nm±5% thick on the substrate to be handled. After disassembly, a roughness of 1.8 nm RMS is measured in the central portion of each of the substrates.

In another embodiment of the invention, a cut was made in the intermediate structure after bonding in order to produce bonding strips having a width of 20 mm. Annealing at 900° C. for 2 h, under a mixed $O_2$+$N_2$ atmosphere, of said strips results in disassembly by, splitting within the porous material of the bonding layer. Under an $N_2$ atmosphere disassembly occurs at 1000° C., i.e. at a higher temperature.

Another embodiment of the invention is shown in FIGS. 2a-2f. It implements, by means of two direct bonding operations, the transfer of a thin layer 10' of the substrate to be handled 10 to a receiving substrate 11.

With reference to FIG. 1a, the handle substrate 2 is coated in a 300-mm porous layer 3 of SiO—$CH_3$ deposited by PECVD (MDEOS+NBD under He+$O_2$). The porogenic agents are removed by UV and heat treatment, which causes a reduction in thickness of about 15%±5%. The deposited layer has a chemical composition of about 15%±5% of Si, 20%±5% of C and O, 45%±5% of H and a porosity of about 20%±10%.

The substrate to be handled 10 is a non highly-doped substrate that comprises, at the surface thereof, at least one portion derived from FEOL steps. The two substrates 2, 10 undergo chemical treatment in order to make the surfaces thereof hydrophilic. This treatment consists of chemical cleaning of the type $O_3$+RCA.

Figure 2A:
FIGS. 2a-2f show a second embodiment of the method according to the invention, wherein a layer of the substrate to be handled is transferred onto a receiving substrate.
Figure 2A:
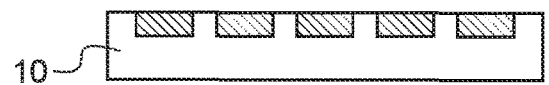
Figure 2B:
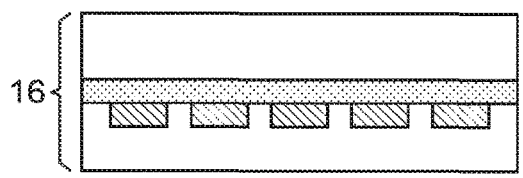

With reference to FIG. 2b, the two substrates are bonded by the direct bonding method at ambient temperature and atmospheric pressure. A first a annealing is applied to the intermediate structure 16 at 400° C. for 2 h in order to consolidate and mechanically strengthen the bonding interface.

Figure 2C:
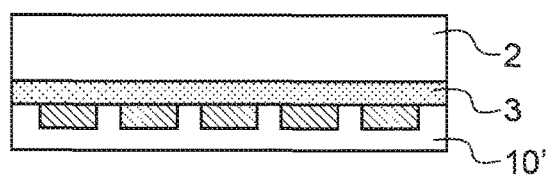

With reference to FIG. 2c, a thinning of the substrate to be handled takes place on the free rear surface thereof in order to form a thin layer 10'. This thinning can take place by mechanical-chemical abrasion or by implementing the Smart Cut™ method, whereby the substrate to be handled has previously undergone ion implantation.

Figure 2D:
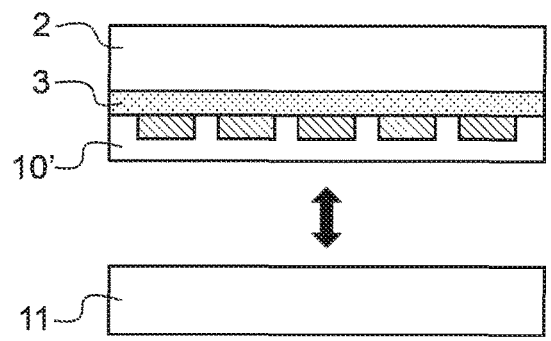

Then, with reference to FIG. 2d, a second hydrophobic bonding takes place between the free rear side of the thinned substrate to be handled 10' and a receiving substrate 11. The receiving substrate is a doped silicon substrate not compatible with the production of the portion derived from FEOL steps present at the surface of the substrate to be handled.

Figure 2E:
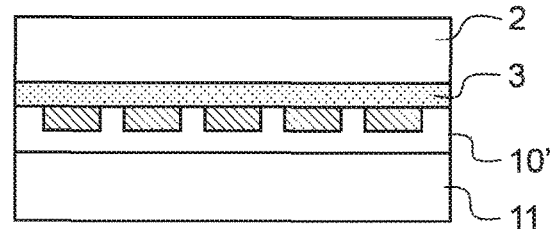
Figure 2F:
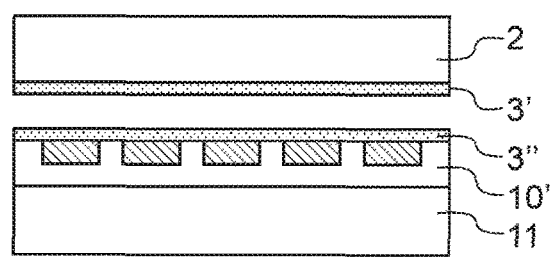

With reference to FIG. 2e, a second annealing takes place for the whole stack produced by the second bonding at 900° C. for 2 h. The purpose of this heat treatment is to consolidate the bonding interface between the thin layer 10' and the receiving substrate 11 and to separate the handle substrate 2 from the thin layer 2' by splitting within the porous layer 3. Said heat treatment takes place at a temperature that is low enough so as not to cause a too significant release of the doping agents.

Figure 3A:
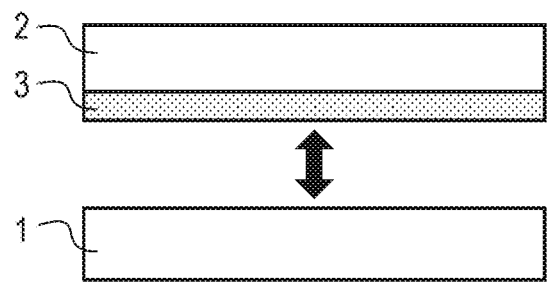
FIGS. 3a-3c show a third embodiment of the method according to the invention, wherein the disassembly of the temporary structure results in a partial separation of the handle substrate.
Figure 3B:
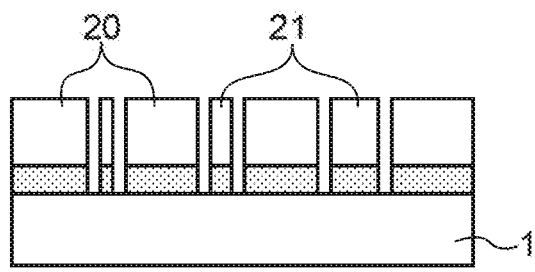
Figure 3C:
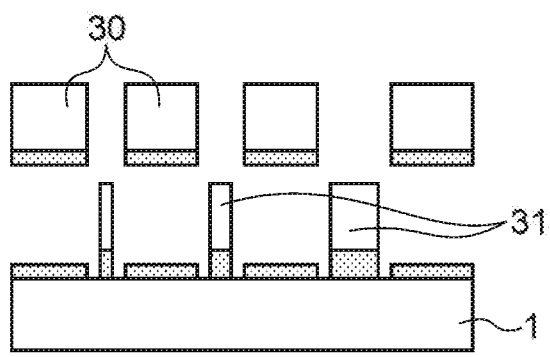

Another embodiment of the invention is shown in FIG. 3a-3b. With reference to FIG. 3a, the substrate to be handled 1 undergoes direct bonding with the handle substrate 2 coated with the bonding layer 3 made of porous material. With reference to FIG. 3b, after direct bonding, a step is performed for cutting the handle substrate 2 in order to form cuts therein, isolating regions 20 of the handle substrate from each other. Regions of variable widths (5, 10, 20 and 40 mm) have thus been isolated. Sealed areas will be created at the edge of each region. Therefore, with reference to FIG. 3c, annealing at 900° C. for 2 h results in the partial separation of the handle substrate located at the isolated regions 20 of the handle substrate, in this case the regions having a width of greater than or equal to 20 mm. In smaller regions, the width of the sealed area at the edge of the region and the low quantity of gas trapped inside the region do not allow for spontaneous separation at this region.

This partial separation can be exploited so as to only cause disassembly on one central portion of the temporary structure. To achieve this, a cut, for example annular in shape, is made in the handle substrate that separates said central portion from a peripheral portion of the handle substrate. Therefore, potentially after additional thinning of the substrate to be handled 1, a membrane is produced in said substrate 1, tensioned over the non-disassembled peripheral portion of the handle substrate, for example an annular portion.

Similarly, one or more cuts can be made in the substrate to be handled 1. It is therefore possible to cause said substrate 1 to separate directly in the form of chips.

Figure 4:
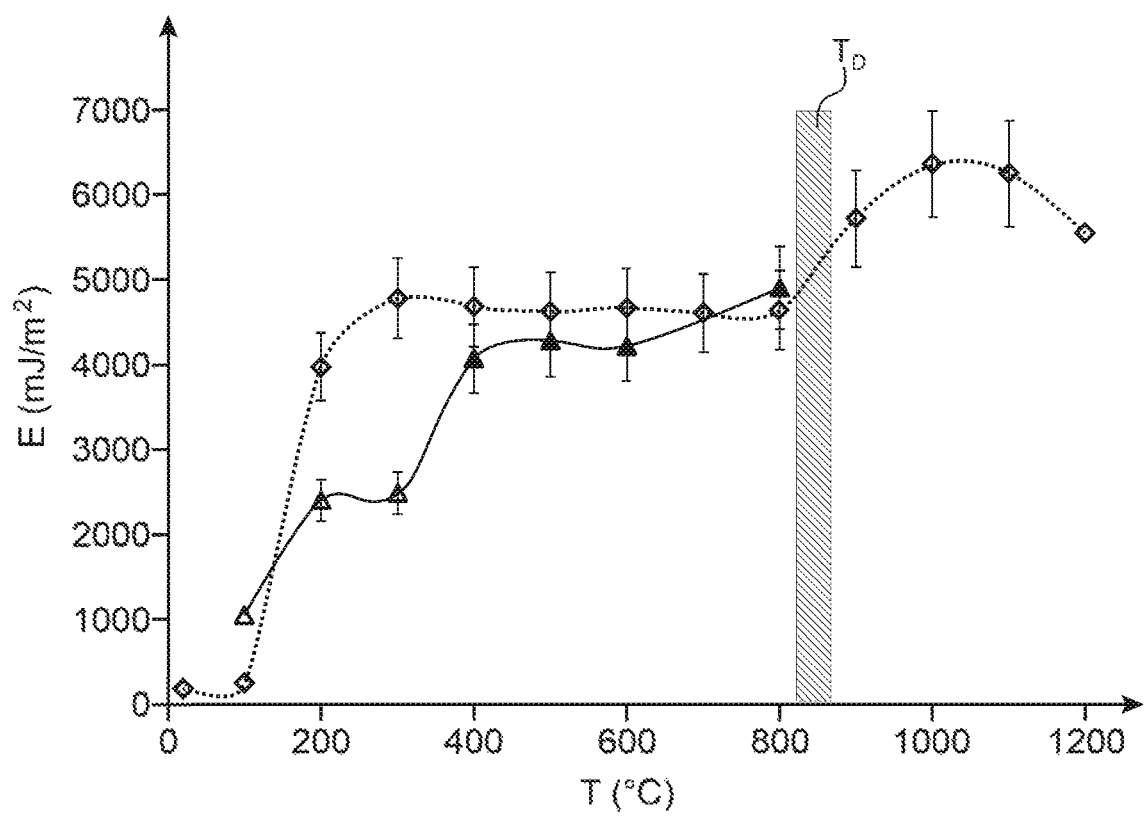
FIG. 4 shows the variation in bonding energy depending on the temperature of a consolidating annealing process applied to the temporary structure.

FIG. 4 shows the variation in bonding energy E, measured using the blade insertion method, as a function of the temperature T of the consolidation annealing process (in this case isothermal annealing for two hours) for $SiO_2$/Si bonding (shown as dotted lines and measurements identified by diamond shapes) and for Si bonding with an initial porosity of 20% (shown as continuous lines and measurements identified by triangle shapes). Below the disassembly temperature $T_D$ (about 830° C.), the bonding energy E is sufficient to allow numerous high-temperature technological methods to be performed (for example dielectric deposition, or thinning). Moreover, this energy does not dissipate, even when approaching the disassembly temperature.

The invention claimed is:

1. A method for manufacturing a semiconductor structure, comprising:
   depositing a bonding layer onto a handle substrate and/or onto a substrate to be handled, the bonding layer including a porous material including an inorganic matrix and organic compounds;
   direct bonding the substrate to be handled with the handle substrate via the bonding layer, to form a temporary structure capable of withstanding technological steps; and
   disassembling the temporary structure at the bonding layer to separate the substrate to be handled from the handle substrate, wherein the disassembling is carried out by providing a thermal budget for disassembly to the intermediate structure, the providing resulting in a spontaneous disassembly of the temporary structure occurring by splitting within the bonding layer.

2. The method according to claim 1, wherein the disassembling takes place under a controlled atmosphere.

3. The method according to claim 1, wherein the providing the thermal budget for disassembly comprises annealing the temporary structure at a temperature exceeding 600° C. for a duration of more than 10 minutes.

4. The method according to claim 1, further comprising strengthening the bonding implemented by providing a thermal budget for reinforcement to the temporary structure.

5. The method according to claim 1, further comprising, before the disassembling, assembling a free rear side of the substrate to be handled with a receiving substrate.

6. The method according to claim 1, further comprising recycling the handle substrate after the disassembling, the recycling comprising removal of residues of the bonding layer present at a surface of the handle substrate by selective etching.

7. The method according to claim 1, wherein the bonding layer has a porosity in a range of 10% to 80%.

8. The method according to claim 1, wherein the bonding layer is a layer of organosilicon material.

9. The method according to claim 1, wherein the bonding layer is a layer whose porosity is self-generated.

10. The method according to claim 1, wherein depositing the bonding layer comprises depositing a matrix precursor on the handle substrate and incorporating a porogenic agent in the deposited matrix precursor.

11. The method according to claim 1, further comprising, after depositing the bonding layer, modifying the porous material by thermal, chemical, UV, electron beam, or plasma post-treatment.

12. The method according to claim 1, further comprising, after the direct bonding, forming at least one cut in the handle substrate to isolate regions of the handle substrate from each other, the disassembling of the temporary structure resulting in a partial separation of the handle substrate located at one or more of the isolated regions of the handle substrate.

13. The method according to claim 12, further comprising forming a cut in the handle substrate separating a central portion of the handle substrate from a peripheral portion of the handle substrate, the disassembling of the temporary structure resulting in a partial separation of the handle substrate located at the central portion of the handle substrate, whereby the substrate to be handled rests on the peripheral portion of the handle substrate.

14. The method according to claim 13, further comprising thinning the substrate to be handled resting on the peripheral portion of the handle substrate.

15. The method according to claim 1, further comprising, after the direct bonding, forming one or more cuts in the substrate to be handled to isolate regions of the substrate to be handled from each other, the disassembling of the temporary structure resulting in a partial separation of the substrate to be handled located at one or more of the isolated regions of the substrate to be handled.

16. The method according to claim 1, wherein the depositing of the bonding layer is performed by at least one of physical vapor deposition; sol-gel deposition; chemical vapor deposition; or plasma enhanced chemical vapor deposition.

17. The method according to claim 1, wherein the porous material includes at least one of carbonate cycles or carbonate chains.

18. The method according to claim 1, wherein the direct bonding is performed by molecular adhesion without any glue and is performed at ambient temperature and at atmospheric pressure.

19. The method according to claim 1, wherein the disassembling takes place under one of a nitrogen atmosphere and mixed $N_2$—$O_2$ atmosphere.

* * * * *